(12) United States Patent
Sugai et al.

(10) Patent No.: US 11,805,632 B2
(45) Date of Patent: Oct. 31, 2023

(54) ELECTRONIC PART PACKAGE BODY AND PEELING METHOD FOR ELECTRONIC PART PACKAGE BODY

(71) Applicant: Taiyo Yuden Co., Ltd., Tokyo (JP)

(72) Inventors: Kazuo Sugai, Tokyo (JP); Atsushi Satori, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 1021 days.

(21) Appl. No.: 16/357,622

(22) Filed: Mar. 19, 2019

(65) Prior Publication Data

US 2019/0307031 A1 Oct. 3, 2019

(30) Foreign Application Priority Data

Mar. 29, 2018 (JP) .................................. 2018-063990

(51) Int. Cl.
*H05K 13/00* (2006.01)
*H01L 21/673* (2006.01)
(Continued)

(52) U.S. Cl.
CPC ....... *H05K 13/0084* (2013.01); *H01L 21/673* (2013.01); *H01L 21/6773* (2013.01); *H01L 21/67132* (2013.01); *H05K 5/0091* (2013.01)

(58) Field of Classification Search
CPC .......... H05K 13/0084; H01L 21/67132; H01L 21/673; H01L 21/6773; Y10T 29/53174
See application file for complete search history.

(56) References Cited

U.S. PATENT DOCUMENTS 5,115,911 A * 5/1992 Schulte .............. H05K 13/0084
206/390
2009/0032430 A1* 2/2009 Wihren .............. H05K 13/0084
206/526
(Continued)

FOREIGN PATENT DOCUMENTS

| JP | 2002-104501 A | 4/2002 |
| JP | 2006321526 A | * 11/2006 |
| JP | 2015-171898 A | 10/2015 |

OTHER PUBLICATIONS

Chenxiao Qiao et al., "Improvement of pick & place yield in carrier tape packaging system through materials selection and cavity structure optimization," 2012 14th International Conference on Electronic Materials and Packaging (EMAP), 2012, pp. 1-4, doi: 10.1109/EMAP.2012.6507836. (Year: 2012).*

*Primary Examiner* — A. Dexter Tugbang
(74) *Attorney, Agent, or Firm* — CHIP LAW GROUP

(57) ABSTRACT

Provided is an electronic part package body including a carrier tape having a plurality of electronic part housing portions arranged in a longitudinal direction, and a cover tape covering at least the electronic part housing portions by being laminated to the carrier tape. The carrier tape includes a first bonded portion and a second bonded portion that are arranged on outsides of both end portions of the plurality of electronic part housing portions, both end portions being end portions in a width direction of the carrier tape, and are arranged in the longitudinal direction of the carrier tape. One of or both the first bonded portion and the second bonded portion include a reentrant part disposed so as to be continuous from the outside of an electronic part housing portion to a region between electronic part housing portions.

18 Claims, 6 Drawing Sheets

(51) Int. Cl.
    *H05K 5/00*         (2006.01)
    *H01L 21/67*       (2006.01)
    *H01L 21/677*     (2006.01)

(56) References Cited

U.S. PATENT DOCUMENTS

| | | | |
|---|---|---|---|
| 2015/0108038 A1* | 4/2015 | Hsu | H05K 13/0084 206/714 |
| 2017/0062262 A1* | 3/2017 | Newman | H05K 13/0084 |

* cited by examiner

CARRIER TAPE
CONVEYANCE DIRECTION

ELECTRONIC PART PACKAGE BODY AND PEELING METHOD FOR ELECTRONIC PART PACKAGE BODY

CROSS REFERENCE TO RELATED APPLICATION

This application is based upon and claims benefit of priority from Japanese Patent Application No. 2018-063990, filed on Mar. 29, 2018, the entire contents of which are incorporated herein by reference.

BACKGROUND

The present disclosure relates to an electronic part package body that can house electronic parts and a peeling method for the electronic part package body.

In the past, an electronic part package body has been known which includes a carrier tape provided with electronic part housing portions housing electronic parts and a cover tape laminated to the carrier tape.

The electronic part package body is typically formed into one package unit by being wound around a take-up reel.

Then, at a time of mounting the electronic parts, the cover tape is peeled off the carrier tape, and the electronic parts are extracted from the electronic part housing portions of the carrier tape.

Hence, such an electronic part package body is desired to be able to maintain the electronic parts in a stably housed state without the electronic parts jumping out from the electronic part housing portions of the carrier tape until the electronic parts are extracted.

Japanese Patent Laid-Open No. 2002-104501 as an example of a related technology discloses a surface mounting electronic part carrier in which compression-bonded portions of a cover tape sealing electronic parts housed in embossed portions are continuously provided in a flowing direction of a carrier tape along opening edge portions of the embossed portions in order to suppress a warp occurring after compression bonding of the cover tape.

In addition, Japanese Patent Laid-Open No. 2015-171898 as an example of a related technology discloses a technology that forms a biting portion biting greatly into a carrier tape in a region in which an electronic part housing portion housing an electronic part is not formed in a sealing portion sealing the carrier tape and a cover tape, and thereby shifts a gap between the cover tape and the carrier tape from above the electronic part housing portion to suppress jumping out of the electronic part.

In recent years, with an increase in speed of mounting with an objective of improving productivity, cover tape peeling speed has been increased. There is accordingly a desire for an electronic part package body that allows the cover tape to be peeled off more stably.

However, the technology disclosed in the above-described Japanese Patent Laid-Open No. 2002-104501 provides bonded portions bonding the carrier tape and the cover tape to each other along the edge portions of the electronic part housing portions, and also intermittently provides bonded portions between the plurality of electronic part housing portions. A peeling force at a time of peeling the cover tape therefore differs depending on positions.

In addition, the technology disclosed in the above-described Japanese Patent Laid-Open No. 2015-171898 forms biting portions in the bonded portions bonding the carrier tape and the cover tape to each other. A peeling force at a time of peeling off the cover tape therefore differs depending on positions.

Thus, according to the above-described related technologies, a peeling force at a time of peeling off the cover tape differs depending on positions, and it is difficult to make this peeling force uniform.

There is consequently a problem of tilting of the electronic parts within the electronic part housing portions or a rupture of the cover tape.

SUMMARY

The present disclosure has been made in view of the above, and it is desirable to provide a technology that makes it possible to house electronic parts stably, and peel off a cover tape smoothly.

The present disclosure has been made on the basis of the recognition of the above problem by the present inventor. It is desirable to provide an electronic part package body including: a carrier tape having a plurality of electronic part housing portions arranged in a longitudinal direction; and a cover tape covering at least the electronic part housing portions by being laminated to the carrier tape; the carrier tape including a first bonded portion and a second bonded portion that are arranged on outsides of both end portions of the plurality of electronic part housing portions, both end portions being end portions in a width direction of the carrier tape, and are arranged in the longitudinal direction of the carrier tape, and one of or both the first bonded portion and the second bonded portion including a reentrant part disposed so as to be continuous from the outside of an electronic part housing portion to a region between electronic part housing portions.

The first bonded portion and the second bonded portion are separated from each other at the reentrant part. Thus, the electronic part housing portions are not sealed, so that the bonded portions are not easily peeled off due to a change in atmospheric pressure during transportation or the like.

The reentrant part can be formed in the region between the electronic part housing portions by including at least one bent part.

Alternatively, the reentrant part may be formed in the region between the electronic part housing portions by including at least one curved part.

Preferably, a width of each of the first bonded portion and the second bonded portion is set to be within ±25% of an average width of each.

More preferably, a width of each of the first bonded portion and the second bonded portion is set to be within ±15% of an average width of each.

Alternatively, the present disclosure is the electronic part package body in which electronic parts are housed in the electronic part housing portions.

Alternatively, the present disclosure is a peeling method for an electronic part package body, the peeling method including peeling off the cover tape of the above-described electronic part package body from the carrier tape by pulling the cover tape.

The present disclosure produces an effect of being able to provide a technology that makes it possible to house electronic parts stably, and peel off a cover tape smoothly.

DETAILED DESCRIPTION OF THE PREFERRED EMBODIMENT

An embodiment of the present disclosure will hereinafter be described with reference to the drawings.

However, the present disclosure is not to be construed in a manner limited by the description of the following embodiment.

Embodiment

Figure 1A:
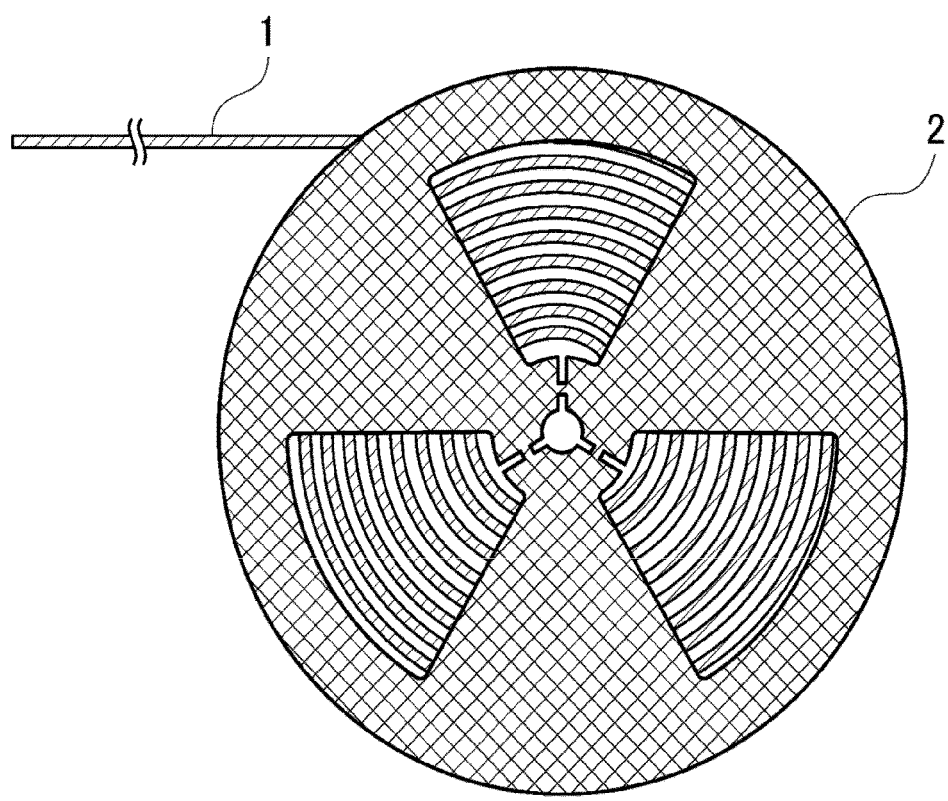
FIG. 1A is an external view depicting a state in which an electronic part package body according to an embodiment is wound around a take-up reel.

FIG. 1A is an external view depicting a state in which an electronic part package body 1 according to the present embodiment is wound around a take-up reel 2.

As depicted in FIG. 1A, the electronic part package body 1 is stored or conveyed in a state of being wound around the take-up reel 2.

Figure 1B:
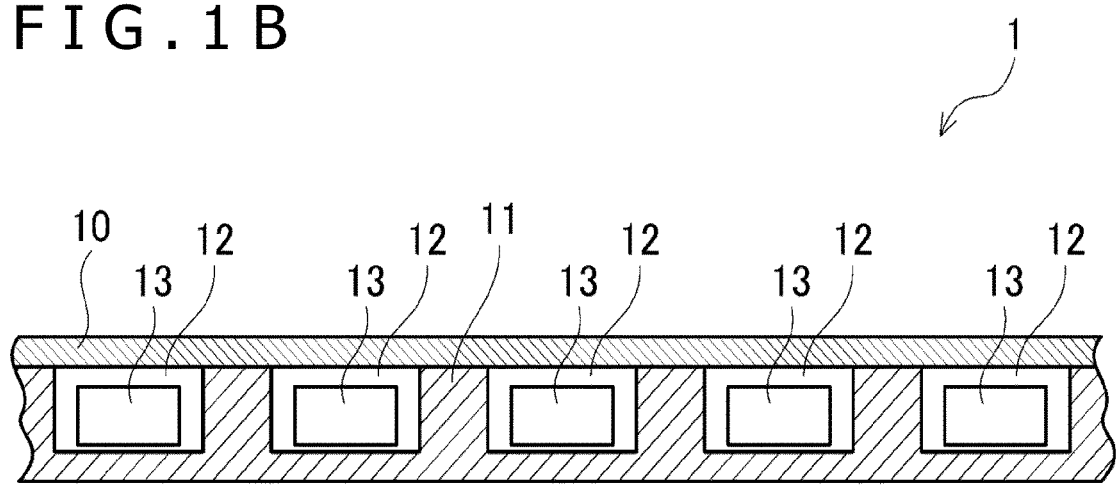
FIG. 1B is an enlarged sectional view of the electronic part package body depicted in FIG. 1A.

FIG. 1B is an enlarged sectional view of the electronic part package body 1 depicted in FIG. 1A.

The electronic part package body 1 depicted in FIG. 1B includes a cover tape 10 and a carrier tape 11.

The carrier tape 11 is provided with a plurality of electronic part housing portions 12 capable of housing electronic parts 13, the electronic part housing portions 12 being arranged in a longitudinal direction.

The cover tape 10 covers at least the electronic part housing portions 12 by being laminated to the carrier tape 11.

At a time of mounting the electronic parts 13, as will be described later, the cover tape 10 is peeled off the carrier tape 11, and the electronic parts 13 are extracted from the electronic part housing portions 12 of the carrier tape 11.

A material for the cover tape 10 can be exemplified by resin.

In addition, a material for the carrier tape 11 can be exemplified by paper and resin.

Here, the resin can be exemplified by polystyrene, polyethylene terephthalate, polypropylene, and polycarbonate.

In addition, each of the plurality of electronic part housing portions 12 is a hollow-shaped recess formed in a bonding surface bonded to the cover tape 10.

Incidentally, it suffices to extract the electronic parts 13 by an ordinary pickup method, and the extraction of the electronic parts 13 is not limited to a particular method.

Such a pickup method can be exemplified by a method of sucking and extracting the electronic parts 13 by a pickup device including a suction collet.

When the electronic part housing portions 12 are shallow, vibration occurring during storage or conveyance may cause the electronic parts 13 to jump out from the electronic part housing portions 12, and move between the plurality of electronic part housing portions 12.

Accordingly, as will be described in the following, in order to prevent the electronic parts 13 from jumping out from the electronic part housing portions 12 and house the electronic parts 13 stably, a separation interval between bonded portions of the cover tape 10 and the carrier tape 11 is reduced in regions between the plurality of electronic part housing portions 12.

Figure 2:
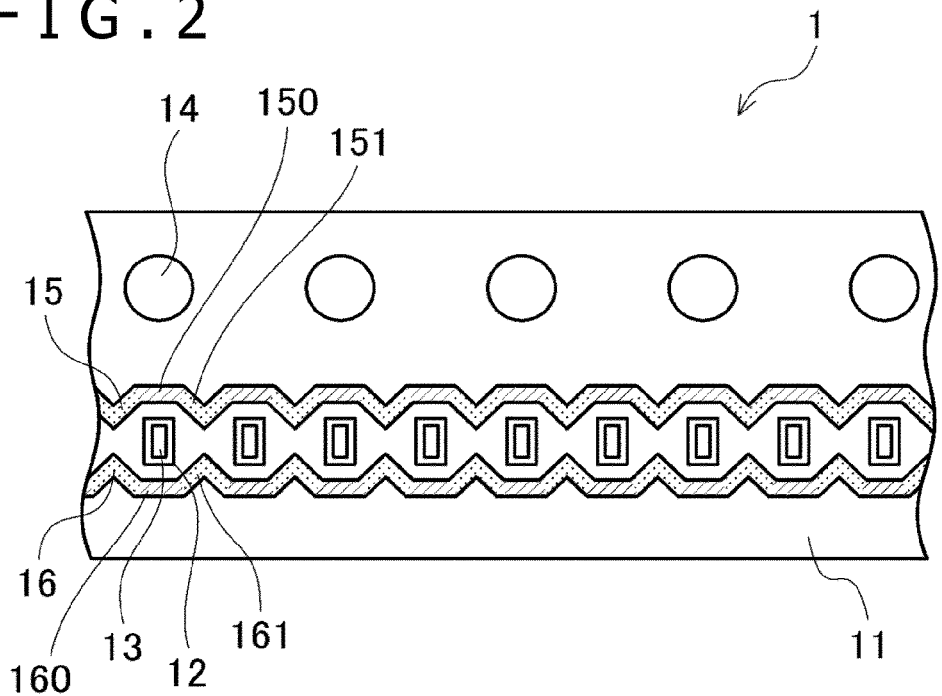
FIG. 2 is a schematic diagram depicting a carrier tape at a bonding surface of the electronic part package body depicted in FIG. 1B.

FIG. 2 is a schematic diagram depicting the carrier tape 11 at the bonding surface of the electronic part package body 1 depicted in FIG. 1B.

FIG. 2 illustrates: a plurality of feed holes 14; the plurality of electronic parts 13; the plurality of electronic part housing portions 12 housing the plurality of electronic parts 13, respectively; a first bonded portion 15 that is disposed between the plurality of feed holes 14 and the plurality of electronic part housing portions 12, that is, on the outside of one end portions of the plurality of electronic part housing portions 12, the one end portions being end portions in a width direction of the carrier tape 11, and is disposed along the longitudinal direction of the carrier tape 11; and a second bonded portion 16 that is disposed on the outside of other end portions of the plurality of electronic part housing portions 12, the other end portions being end portions in the width direction of the carrier tape 11, and is disposed along the longitudinal direction of the carrier tape 11.

The first bonded portion 15 and the second bonded portion 16 include a reentrant part disposed so as to be continuous from the outside of an electronic part housing portion 12 to a region between electronic part housing portions 12.

As depicted in FIG. 2, the first bonded portion 15 is disposed between the plurality of feed holes 14 and the plurality of electronic part housing portions 12, the first bonded portion 15 and the second bonded portion 16 are arranged so as to be separated from each other, and the plurality of electronic part housing portions 12 are arranged between the first bonded portion 15 and the second bonded portion 16.

The lateral direction of the electronic part housing portions 12 in a substantially rectangular shape substantially coincides with the longitudinal direction of the carrier tape 11.

The electronic parts 13 have a substantially rectangular shape as with the electronic part housing portions 12. The lateral direction of the electronic parts 13 substantially coincides with the lateral direction of the electronic part housing portions 12.

The first bonded portion 15 includes: a linear part 150 disposed between the plurality of feed holes 14 and the plurality of electronic part housing portions 12, that is, on the outside of the plurality of electronic part housing portions 12; and a bent part 151 continuous from the linear part 150 and bent between a plurality of adjacent electronic part housing portions 12. The linear part 150 and the bent part 151 are arranged alternately and repeatedly.

The first bonded portion 15 has an inwardly bent shape due to the bent part 151.

The second bonded portion 16 is disposed at a position axisymmetric to the first bonded portion 15 with respect to the plurality of electronic part housing portions 12.

The second bonded portion 16 includes: a linear part 160 disposed on an opposite side from the linear part 150 of the first bonded portion 15 with respect to the plurality of electronic part housing portions 12; and a bent part 161 continuous from the linear part 160 and bent between a plurality of adjacent electronic part housing portions 12. The linear part 160 and the bent part 161 are arranged alternately and repeatedly.

The second bonded portion 16 has an inwardly bent shape due to the bent part 161.

Thus, the inward bending of both the first bonded portion 15 and the second bonded portion 16 narrows a region surrounded by the plurality of adjacent electronic part housing portions 12 and the two bonded portions. It is thereby possible to suppress floating of the cover tape 10 in the lateral direction of the electronic parts 13.

The electronic part package body 1 can therefore house the electronic parts 13 stably by preventing the electronic parts 13 from jumping out from the electronic part housing portions 12.

In addition, the width of each of the first bonded portion 15 and the second bonded portion 16 is preferably set to be within ±25% of an average width of each.

More preferably, the width of each of the first bonded portion 15 and the second bonded portion 16 is set to be within ±15% of the average width of each.

When the width of the bonded portions is thus made uniform and set to be a substantially fixed width, a peeling force at a time of peeling off the cover tape can be made uniform, so that the peeling can be performed smoothly while vibration during the peeling is suppressed.

The first bonded portion 15 and the second bonded portion 16 are preferably separated from each other at the reentrant parts.

A reason therefor is that when the first bonded portion 15 and the second bonded portion 16 are connected to each other by the reentrant parts, the electronic part housing portions are sealed by the cover tape, so that when an ambient atmospheric pressure is decreased, an air in a sealed part expands, and causes the first and second bonded portions to be peeled from the electronic part housing portion side. In addition, when the air in the sealed part expands, a gap between the carrier tape and the cover tape is increased, and the product is caught in this gap.

The electronic parts can be housed stably when a separation dimension in a width direction at the reentrant parts of the first and second bonded portions is less than a dimension in the longitudinal direction of the electronic parts housed in the electronic part housing portions. Further, the separation dimension is preferably less than ¾ of the dimension in the longitudinal direction of the electronic parts housed in the electronic part housing portions, and is more preferably less than ½ of the dimension in the longitudinal direction of the electronic parts housed in the electronic part housing portions.

<Method of Forming Bonded Portions in Electronic Part Package Body>

The first bonded portion 15 and the second bonded portion 16 can be formed by bringing a heating unit into contact with the cover tape 10 in a state in which the cover tape 10 is superposed on the carrier tape 11.

Figure 3A:
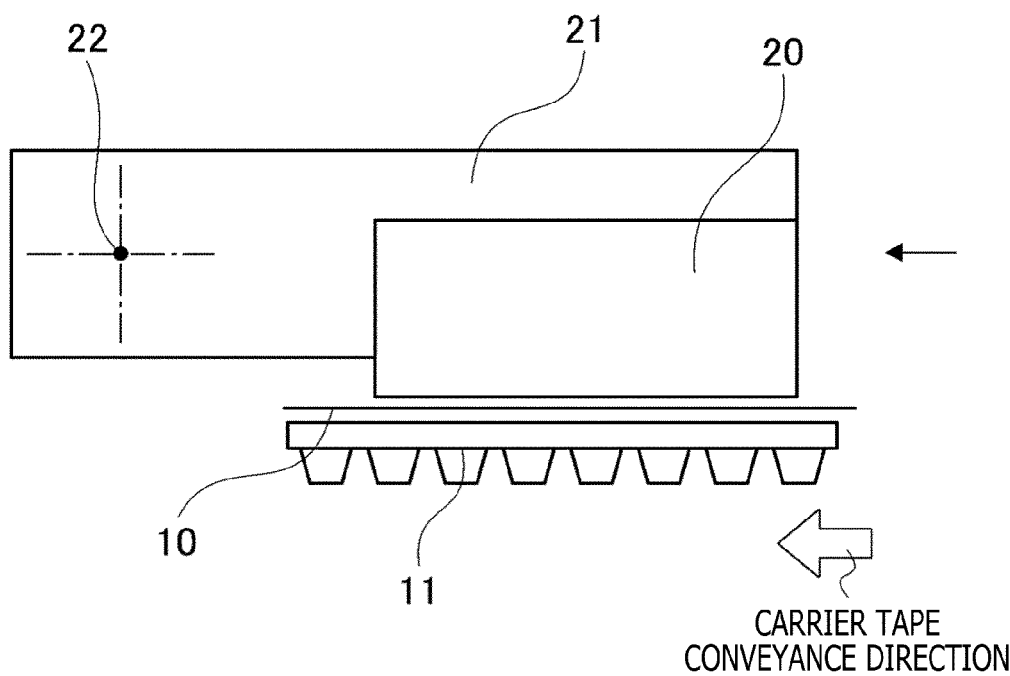
FIG. 3A is a diagram depicting a method of forming bonded portions in the electronic part package body according to the embodiment.

FIG. 3A is a diagram depicting a method of forming the bonded portions in the electronic part package body 1 according to the present embodiment.

FIG. 3A illustrates the carrier tape 11, the cover tape 10 superposed on the carrier tape 11, an iron heating unit 20 that comes into contact with the cover tape 10, and an iron 21 that can move the iron heating unit 20 vertically by rotating about a rotation axis 22.

Incidentally, the rotation axis 22 of the iron 21 is disposed in a direction orthogonal to a paper plane.

In FIG. 3A, when the iron 21 rotates clockwise about the rotation axis 22, the iron heating unit 20 approaches the cover tape 10 and comes into contact with the cover tape 10. When the iron 21 rotates counterclockwise about the rotation axis 22, the iron heating unit 20 is separated from the cover tape 10.

Figure 3B:
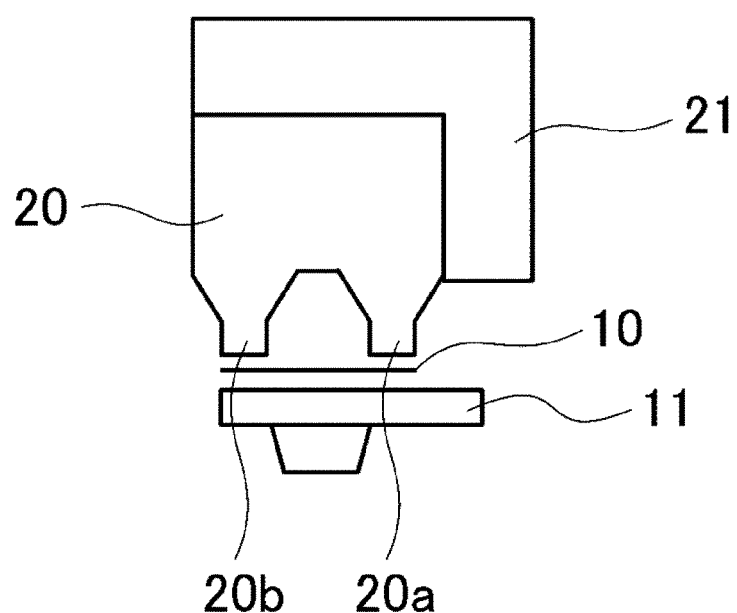
FIG. 3B is a view taken in the direction of an arrow depicted in FIG. 3A.

FIG. 3B is a view taken in the direction of an arrow depicted in FIG. 3A.

As depicted in FIG. 3B, the iron heating unit 20 includes a first contact portion 20a and a second contact portion 20b, and the first contact portion 20a and the second contact portion 20b are arranged so as to be separated from each other.

When the first contact portion 20a and the second contact portion 20b that are heated are brought into contact with the cover tape 10 in a state in which the cover tape 10 is superposed on the carrier tape 11 housing the electronic parts 13, contact parts of the cover tape 10 and the carrier tape 11 are welded to each other.

Then, the first contact portion 20a and the second contact portion 20b are separated from the cover tape 10, the carrier tape 11 is shifted by an amount corresponding to at least one electronic part housing portion 12 in a carrier tape conveyance direction indicated by an outlined arrow in FIG. 3A, and the first contact portion 20a and the second contact portion 20b are brought into contact with the cover tape 10 again. The welded parts of the cover tape 10 and the carrier tape 11 are thereby welded again.

The welded parts are welded to each other a plurality of times by repeating such operation. The first bonded portion 15 and the second bonded portion 16 are thereby formed.

Incidentally, the shape of the first bonded portion 15 and the second bonded portion 16 reflects the shape of the iron heating unit 20. Thus, it suffices to select the iron heating unit 20 such that the shape of the bonded portions is a desired shape.

The electronic part package body 1 depicted in FIG. 2 can be thus fabricated.

After conveyance of the electronic part package body 1 fabricated as described above or after storage of the electronic part package body 1, the cover tape 10 is peeled off at a time of mounting the electronic parts 13.

Figure 4:
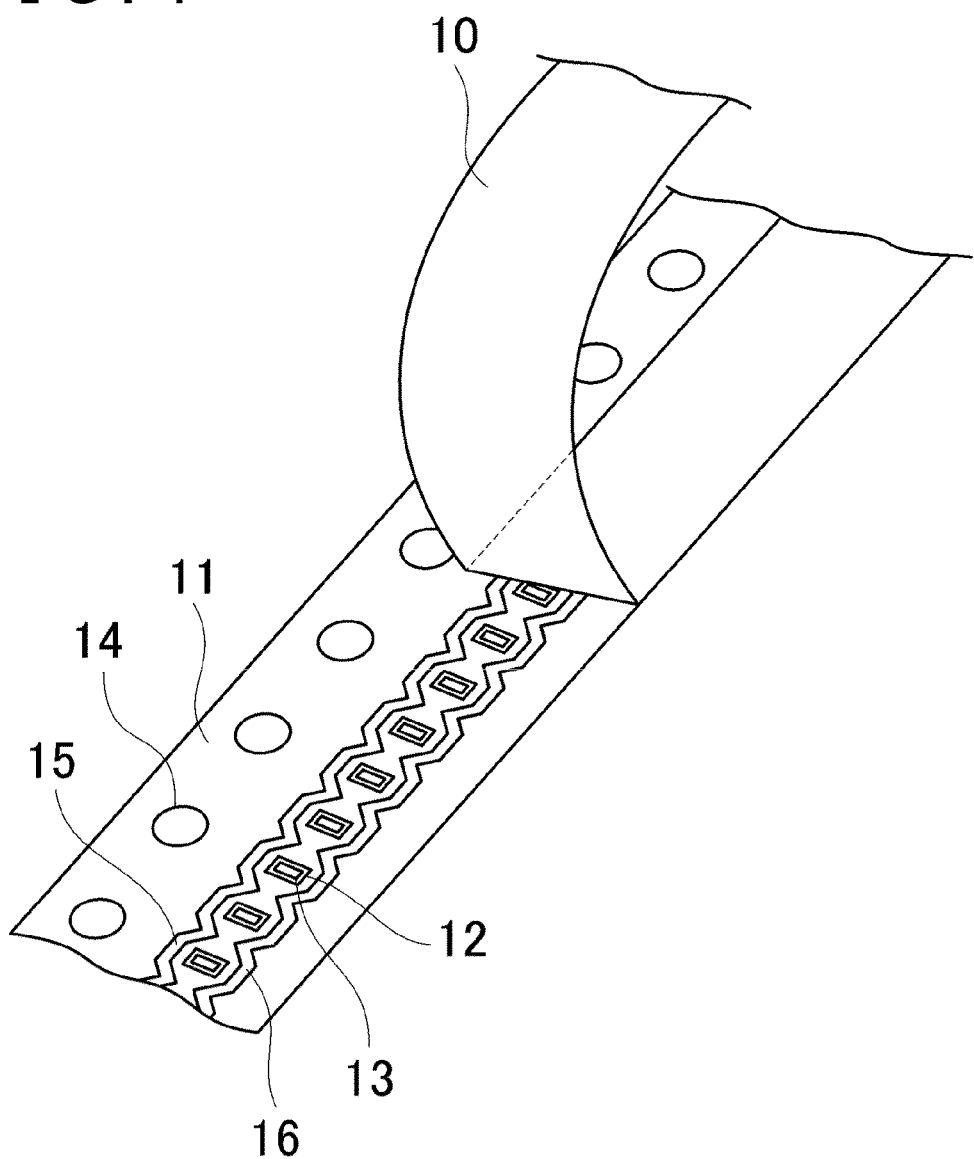
FIG. 4 is a diagram depicting a peeling method for the electronic part package body according to the embodiment.

FIG. 4 is a diagram depicting a peeling method for the electronic part package body 1 according to the present embodiment.

FIG. 4 depicts a state in which the cover tape 10 laminated to the carrier tape 11 is peeled off. The carrier tape 11 depicted in FIG. 4 includes the electronic part housing portions 12 housing the electronic parts 13, the plurality of feed holes 14, the first bonded portion 15, and the second bonded portion 16.

As described above, each of the first bonded portion 15 and the second bonded portion 16 of the electronic part package body 1 according to the present embodiment is arranged with a substantially fixed width.

Therefore, when the cover tape 10 is pulled from the carrier tape 11, a peeling force can be made uniform. As a result, the peeling can be performed smoothly while vibration during the peeling is suppressed.

As described above, the shape of the first bonded portion and the second bonded portion is determined by the shape of the contact portions of the iron heating unit at the time of welding.

Modifications of the first bonded portion and the second bonded portion in the present embodiment will next be described.

First Modification

Figure 5:
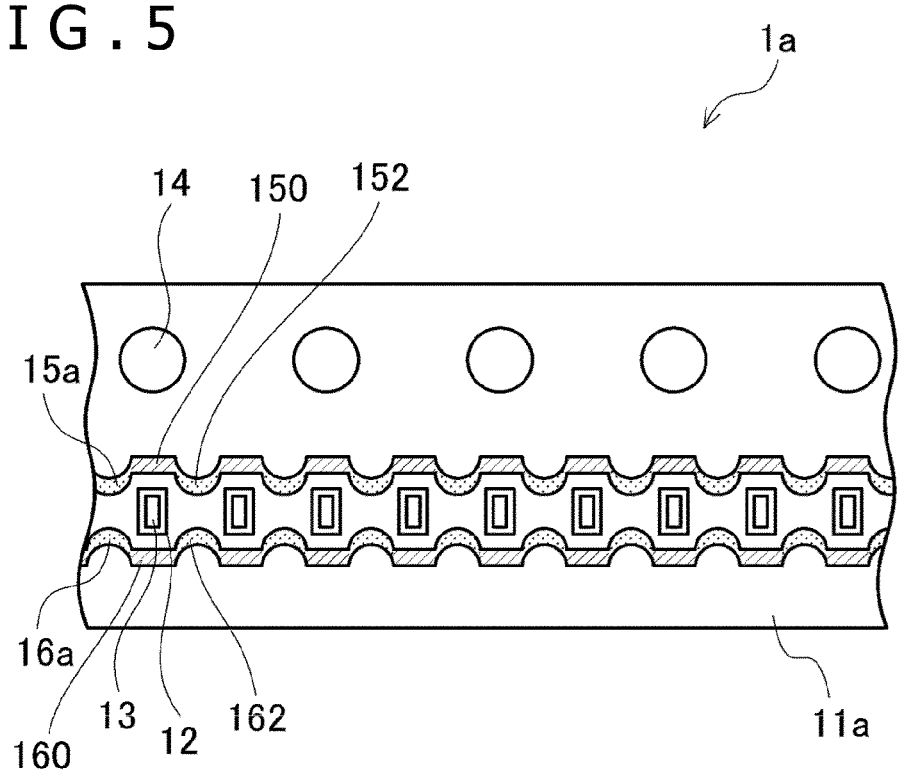
FIG. 5 is a schematic diagram depicting a carrier tape at a bonding surface in a first modification of the electronic part package body according to the embodiment.

FIG. 5 is a schematic diagram depicting a carrier tape at a bonding surface in a first modification of the electronic part package body 1 according to the present embodiment.

An electronic part package body 1a depicted in FIG. 5 is different from the electronic part package body 1 depicted in FIG. 2 only in the shape of bonded portions, and the electronic part package body 1a otherwise has the same configuration. The description of FIG. 2 will therefore be quoted.

FIG. 5 illustrates: a first bonded portion 15a that is disposed between the plurality of feed holes 14 and the plurality of electronic part housing portions 12, that is, on the outside of one end portions of the plurality of electronic part housing portions 12, the one end portions being end portions in the width direction of a carrier tape 11a, and is disposed along the longitudinal direction of the carrier tape 11a; and a second bonded portion 16a that is disposed on the outside of other end portions of the plurality of electronic part housing portions 12, the other end portions being end portions in the width direction of the carrier tape 11a, and is disposed along the longitudinal direction of the carrier tape 11a.

The first bonded portion 15a and the second bonded portion 16a include a reentrant part in a region between a plurality of electronic part housing portions 12.

As depicted in FIG. 5, the first bonded portion 15a is disposed between the plurality of feed holes 14 and the plurality of electronic part housing portions 12, the first bonded portion 15a and the second bonded portion 16a are arranged so as to be separated from each other, and the plurality of electronic part housing portions 12 are arranged between the first bonded portion 15a and the second bonded portion 16a.

The first bonded portion 15a includes: a linear part 150 disposed between the plurality of feed holes 14 and the plurality of electronic part housing portions 12, that is, on the outside of the plurality of electronic part housing portions 12; and a curved part 152 continuous from the linear part 150 and curved between a plurality of adjacent electronic part housing portions 12. The linear part 150 and the curved part 152 are arranged alternately and repeatedly.

The first bonded portion 15a has an inwardly bent shape due to the curved part 152.

The second bonded portion 16a is disposed at a position axisymmetric to the first bonded portion 15a with respect to the plurality of electronic part housing portions 12.

The second bonded portion 16a includes a linear part 160 disposed on an opposite side from the linear part 150 of the first bonded portion 15a with respect to the plurality of electronic part housing portions 12, and a curved part 162 continuous from the linear part 160 and curved between a plurality of adjacent electronic part housing portions 12. The linear part 160 and the curved part 162 are arranged alternately and repeatedly.

The second bonded portion 16a has an inwardly bent shape due to the curved part 162.

Thus, the inward curving of both the first bonded portion 15a and the second bonded portion 16a narrows a region surrounded by the plurality of adjacent electronic part housing portions 12 and the two bonded portions. It is thereby possible to suppress floating of the cover tape 10 in the lateral direction of the electronic parts 13.

The electronic part package body 1a can therefore house the electronic parts 13 stably by preventing the electronic parts 13 from jumping out from the electronic part housing portions 12.

In addition, the width of the first bonded portion 15a and the second bonded portion 16a is preferably set to be within ±25% of an average width of each.

More preferably, the width of the first bonded portion 15a and the second bonded portion 16a is set to be within ±15% of the average width of each.

When the width of the bonded portions is thus made uniform and set to be a substantially fixed width, a peeling force at a time of peeling off the cover tape can be made uniform, so that the peeling can be performed smoothly while vibration during the peeling is suppressed.

The first bonded portion 15a and the second bonded portion 16a are preferably separated from each other at the reentrant parts.

A reason therefor is that when the first bonded portion 15a and the second bonded portion 16a are connected to each other by the reentrant parts, the electronic part housing portions are sealed by the cover tape, so that when an ambient atmospheric pressure is decreased, an air in a sealed part expands, and causes the first and second bonded portions to be peeled from the electronic part housing portion side. In addition, when the air in the sealed part expands, a gap between the carrier tape and the cover tape is increased, and the product is caught in this gap.

The electronic parts can be housed stably when a separation dimension in a width direction at the reentrant parts of the first and second bonded portions is less than a dimension in the longitudinal direction of the electronic parts housed in the electronic part housing portions. Further, the separation dimension is preferably less than ¾ of the dimension in the longitudinal direction of the electronic parts housed in the electronic part housing portions, and is more preferably less than ½ of the dimension in the longitudinal direction of the electronic parts housed in the electronic part housing portions.

Second Modification

Figure 6:
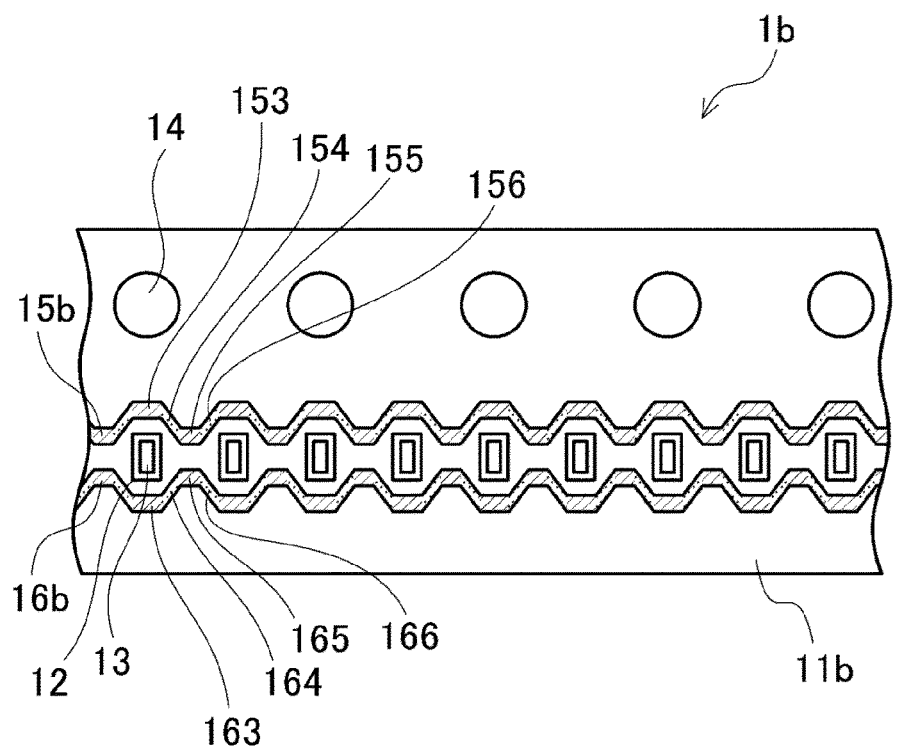
FIG. 6 is a schematic diagram depicting a carrier tape at a bonding surface in a second modification of the electronic part package body according to the embodiment.

FIG. 6 is a schematic diagram depicting a carrier tape at a bonding surface in a second modification of the electronic part package body 1 according to the present embodiment.

An electronic part package body 1b depicted in FIG. 6 is different from the electronic part package body 1 depicted in FIG. 2 only in the shape of bonded portions, and the electronic part package body 1b otherwise has the same configuration. The description of FIG. 2 will therefore be quoted.

FIG. 6 illustrates: a first bonded portion 15b that is disposed between the plurality of feed holes 14 and the plurality of electronic part housing portions 12, that is, on the outside of one end portions of the plurality of electronic part housing portions 12, the one end portions being end portions in the width direction of a carrier tape 11b, and is disposed along the longitudinal direction of the carrier tape 11b; and a second bonded portion 16b that is disposed on the outside of other end portions of the plurality of electronic part housing portions 12, the other end portions being end portions in the width direction of the carrier tape 11b, and is disposed along the longitudinal direction of the carrier tape 11b.

The first bonded portion 15b and the second bonded portion 16b include a reentrant part in a region between a plurality of electronic part housing portions 12.

As depicted in FIG. 6, the first bonded portion 15b is disposed between the plurality of feed holes 14 and the plurality of electronic part housing portions 12, the first bonded portion 15b and the second bonded portion 16b are arranged so as to be separated from each other, and the plurality of electronic part housing portions 12 are arranged between the first bonded portion 15b and the second bonded portion 16b.

The first bonded portion 15b includes: a first linear part 153 disposed between the plurality of feed holes 14 and the plurality of electronic part housing portions 12, that is, on the outside of the plurality of electronic part housing portions 12; a first bent part 154 continuous from the first linear part 153 and bent between a plurality of adjacent electronic part housing portions 12; a second linear part 155 continuous from the first bent part 154 and disposed between the plurality of adjacent electronic part housing portions 12; and a second bent part 156 continuous from the second linear part 155 and bent between the plurality of adjacent electronic part housing portions 12. The first linear part 153, the first bent part 154, the second linear part 155, and the second bent part 156 are arranged alternately and repeatedly in this order.

The first bonded portion 15b has an inwardly bent shape due to the first bent part 154 and the second bent part 156.

The second bonded portion 16b is disposed at a position axisymmetric to the first bonded portion 15b with respect to the plurality of electronic part housing portions 12.

The second bonded portion 16b includes a first linear part 163 disposed on an opposite side from the first linear part 153 of the first bonded portion 15b with respect to the plurality of electronic part housing portions 12, a first bent part 164 continuous from the first linear part 163 and bent between a plurality of adjacent electronic part housing portions 12, a second linear part 165 continuous from the first bent part 164 and disposed between the plurality of adjacent electronic part housing portions 12, and a second bent part 166 continuous from the second linear part 165 and bent between the plurality of adjacent electronic part housing portions 12. The first linear part 163, the first bent part 164, the second linear part 165, and the second bent part 166 are arranged alternately and repeatedly in this order.

The second bonded portion 16b has an inwardly bent shape due to the first bent part 164 and the second bent part 166.

In addition, the first bonded portion 15b and the second bonded portion 16b are arranged in positions axisymmetric to each other with respect to the plurality of electronic part housing portions 12.

Thus, not only are both the first bonded portion 15b and the second bonded portion 16b bent inward, but also the first bonded portion 15b is provided with the second linear part 155 between the plurality of adjacent electronic part housing portions 12 and the second bonded portion 16b is provided with the second linear part 165 between the plurality of adjacent electronic part housing portions 12. Hence, a region between the plurality of adjacent electronic part housing portions 12 can be further narrowed while wide bent parts are secured, so that floating of the cover tape in the lateral direction of the electronic parts 13 can be suppressed.

The electronic part package body 1b can therefore house the electronic parts 13 stably by preventing the electronic parts 13 from jumping out from the electronic part housing portions 12.

In addition, the width of the first bonded portion 15b and the second bonded portion 16b is preferably set to be within ±25% of an average width of each.

More preferably, the width of the first bonded portion 15b and the second bonded portion 16b is set to be within ±15% of the average width of each.

When the width of the bonded portions is thus made uniform and set to be a substantially fixed width, a peeling force at a time of peeling off the cover tape can be made uniform, so that the peeling can be performed smoothly while vibration during the peeling is suppressed.

The first bonded portion 15b and the second bonded portion 16b are preferably separated from each other at the reentrant parts.

A reason therefor is that when the first bonded portion 15b and the second bonded portion 16b are connected to each other by the reentrant parts, the electronic part housing portions are sealed by the cover tape, so that when an ambient atmospheric pressure is decreased, an air in a sealed part expands, and causes the first and second bonded portions to be peeled from the electronic part housing portion side. In addition, when the air in the sealed part expands, a gap between the carrier tape and the cover tape is increased, and the product is caught in this gap.

The electronic parts can be housed stably when a separation dimension in a width direction at the reentrant parts of the first and second bonded portions is less than a dimension in the longitudinal direction of the electronic parts housed in the electronic part housing portions. Further, the separation dimension is preferably less than ¾ of the dimension in the longitudinal direction of the electronic parts housed in the electronic part housing portions, and is more preferably less than ½ of the dimension in the longitudinal direction of the electronic parts housed in the electronic part housing portions.

Third Modification

Figure 7:
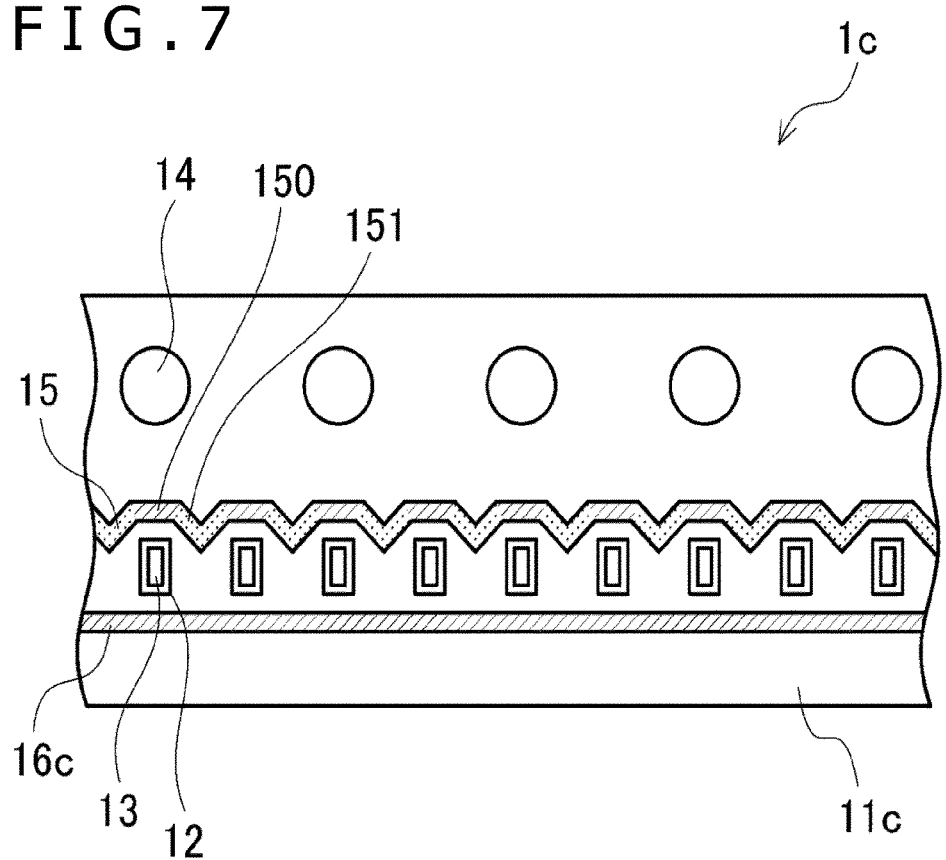
FIG. 7 is a schematic diagram depicting a carrier tape at a bonding surface in a third modification of the electronic part package body according to the embodiment.

FIG. 7 is a schematic diagram depicting a carrier tape at a bonding surface in a third modification of the electronic part package body 1 according to the present embodiment.

An electronic part package body 1c depicted in FIG. 7 is different from the electronic part package body depicted in FIG. 2 only in the shape of a second bonded portion, and the electronic part package body 1c otherwise has the same configuration. The description of FIG. 2 will therefore be quoted.

FIG. 7 illustrates: a first bonded portion 15 that is disposed between the plurality of feed holes 14 and the plurality of electronic part housing portions 12, that is, on the outside of one end portions of the plurality of electronic part housing portions 12, the one end portions being end portions in the width direction of a carrier tape 11c, and is disposed along the longitudinal direction of the carrier tape 11c; and a second bonded portion 16c that is disposed on the outside of other end portions of the plurality of electronic part housing portions 12, the other end portions being end portions in the width direction of the carrier tape 11c, and is disposed along the longitudinal direction of the carrier tape 11c.

The first bonded portion 15 is of a shape including a reentrant part in a region between a plurality of electronic part housing portions 12 as in FIG. 2. However, the second bonded portion 16c is linear.

Thus, the region between the plurality of electronic part housing portions 12 can be narrowed even when one of the two bonded portions is linear and the other is bent or curved inward. Hence, floating of the cover tape in the lateral direction of the electronic parts 13 can be suppressed also by the form depicted in FIG. 7.

The electronic part package body 1c can therefore house the electronic parts 13 stably by preventing the electronic parts 13 from jumping out from the electronic part housing portions 12.

In addition, the width of the first bonded portion 15 and the second bonded portion 16c is preferably set to be within ±25% of an average width of each.

More preferably, the width of the first bonded portion 15 and the second bonded portion 16c is set to be within ±15% of the average width of each.

When the width of the bonded portions is thus made uniform and set to be a substantially fixed width, a peeling force at a time of peeling off the cover tape can be made uniform, so that the peeling can be performed smoothly while vibration during the peeling is suppressed.

The first bonded portion 15 and the second bonded portion 16c are preferably separated from each other at the reentrant parts.

A reason therefor is that when the first bonded portion 15 and the second bonded portion 16c are connected to each other by the reentrant parts, the electronic part housing portions are sealed by the cover tape, so that when an ambient atmospheric pressure is decreased, an air in a sealed part expands, and causes the first and second bonded portions to be peeled from the electronic part housing portion side. In addition, when the air in the sealed part expands, a gap between the carrier tape and the cover tape is increased, and the product is caught in this gap.

The electronic parts can be housed stably when a separation dimension in a width direction at the reentrant parts of the first and second bonded portions is less than a dimension in the longitudinal direction of the electronic parts housed in the electronic part housing portions. Further, the separation dimension is preferably less than ¾ of the dimension in the longitudinal direction of the electronic parts housed in the electronic part housing portions, and is more preferably less than ½ of the dimension in the longitudinal direction of the electronic parts housed in the electronic part housing portions.

Incidentally, a form in which a region between a plurality of electronic part housing portions 12 is narrowed by one bonded portion and the other bonded portion is made to be of a linear shape as in the present modification may be combined with the foregoing first and second modifications.

In addition, as depicted in FIGS. 2, 5, 6, and 7, in the present embodiment, one or both of the two bonded portions disposed on the outside of the plurality of electronic part housing portions 12 are formed so as to include a reentrant part between a plurality of electronic part housing portions 12.

This reentrant part can be realized by having at least one bent part or curved part, as described above.

In addition, the reentrant part may have both the bent part and the curved part.

It is to be noted that while in the present embodiment, description has been made of the two bonded portions having a linear part on the outside, as described above, the present disclosure is not limited to this. The outsides of the two bonded portions may be of a curved shape.

In addition, a method of fabricating the electronic part package bodies 1a, 1b, and 1c depicted in FIGS. 5 to 7 is similar to that of the electronic part package body 1, and therefore the description with reference to FIGS. 3A and 3B will be quoted.

In addition, a peeling method for the electronic part package bodies 1a, 1b, and 1c depicted in FIGS. 5 to 7 is similar to that of the electronic part package body 1, and therefore the description with reference to FIG. 4 will be quoted.

In addition, in the present embodiment, description has been made of an electronic part package body including a carrier tape housing electronic parts. However, the present disclosure is not limited to this. An electronic part package body including a carrier tape in a state of not housing electronic parts is also included in the present disclosure.

As described above, according to the present embodiment, it is possible to obtain an electronic part package body that houses electronic parts stably and makes it possible to peel off a cover tape smoothly.

Hence, mounting failures can be suppressed, and a mounting rate can be improved.

The present disclosure contains subject matter related to that disclosed in Japanese Priority Patent Application JP 2018-063990 filed in the Japan Patent Office on Mar. 29, 2018, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:
1. An electronic part package body, comprising:
a carrier tape having a plurality of electronic part housing portions arranged in a longitudinal direction; and
a cover tape covering at least the plurality of electronic part housing portions by being laminated to the carrier tape, wherein
the carrier tape includes a first bonded portion and a second bonded portion that are arranged on outsides of both end portions of the plurality of electronic part housing portions,
the both end portions are in a width direction of the carrier tape,
the first bonded portion and the second bonded portion are arranged in the longitudinal direction of the carrier tape,
the first bonded portion is separated from the second bonded portion in the width direction of the carrier tape,
each of a plurality of first widths of the first bonded portion is within +25% of a first average width of the plurality of first widths,
each of a plurality of second widths of the second bonded portion is within +25% of a second average width of the plurality of second widths,
at least one of the first bonded portion or the second bonded portion includes a plurality of reentrant parts in the longitudinal direction of the carrier tape,
each of the plurality of reentrant parts is continuous from an outside of an electronic part housing portion of the plurality of electronic part housing portions to a region between the plurality of electronic part housing portions, and
the plurality of reentrant parts includes at least one of a bent part bonded to the cover tape or a curved part bonded to the cover tape.

2. The electronic part package body according to claim 1, wherein the first bonded portion is separated from the second bonded portion at the plurality of reentrant parts.

3. The electronic part package body according to claim 2, wherein
each of the first bonded portion and the second bonded portion includes the plurality of reentrant parts, and
a separation distance between a reentrant part of the plurality of reentrant parts of the first bonded portion and a reentrant part of the plurality of reentrant parts of the second bonded portion in the width direction of the carrier tape is less than ¾ of a length of an electronic part housed in the electronic part housing portion.

4. The electronic part package body according to claim 1, wherein a reentrant part of the plurality of reentrant parts includes the bent part.

5. The electronic part package body according to claim 1, wherein a reentrant part of the plurality of reentrant parts includes the curved part.

6. The electronic part package body according to claim 1, wherein
each of the plurality of first widths of the first bonded portion is within +15% of the first average width of the plurality of first widths, and
each of the plurality of second widths of the second bonded portion is within +15% of the second average width of the plurality of second widths.

7. The electronic part package body according to claim 1, wherein electronic parts are housed in the plurality of electronic part housing portions.

8. The electronic part package body according to claim 1, wherein each of the first bonded portion and the second bonded portion has a uniform width.

9. The electronic part package body according to claim 1, wherein
the at least one of the first bonded portion or the second bonded portion further includes a plurality of linear parts on an end portion of the both end portions, and
in the longitudinal direction of the carrier tape, a reentrant part of the plurality of reentrant parts connects two adjacent linear parts of the plurality of linear parts.

10. An electronic part package body, comprising:
a carrier tape having a plurality of electronic part housing portions arranged in a longitudinal direction; and
a cover tape covering at least the plurality of electronic part housing portions by being laminated to the carrier tape, wherein
the carrier tape includes:
a plurality of feed holes, and
a first bonded portion and a second bonded portion that are arranged on outsides of both end portions of the plurality of electronic part housing portions,
the both end portions are in a width direction of the carrier tape,
the first bonded portion is between the plurality of feed holes and the plurality of electronic part housing portions in the width direction of the carrier tape,
the plurality of electronic part housing portions is between the first bonded portion and the second bonded portion in the width direction of the carrier tape,
the first bonded portion and the second bonded portion are arranged in the longitudinal direction of the carrier tape,
each of a plurality of first widths of the first bonded portion is within +25% of a first average width of the plurality of first widths,
each of a plurality of second widths of the second bonded portion is within +25% of a second average width of the plurality of second widths,
at least one of the first bonded portion or the second bonded portion includes a reentrant part disposed so as to be continuous from an outside of an electronic part housing portion of the plurality of electronic part housing portions to a region between the plurality of electronic part housing portions, and
the reentrant part includes at least one of a bent part bonded to the cover tape or a curved part bonded to the cover tape.

11. The electronic part package body according to claim 10, wherein the first bonded portion is separated from the second bonded portion at the reentrant part.

12. The electronic part package body according to claim 11, wherein
each of the first bonded portion and the second bonded portion includes the reentrant part, and
a separation distance between the reentrant part of the first bonded portion and the reentrant part of the second bonded portion in the width direction of the carrier tape is less than ¾ of a length of an electronic part housed in the electronic part housing portion.

13. The electronic part package body according to claim 10, wherein the reentrant part includes the bent part.

14. The electronic part package body according to claim 10, wherein the reentrant part includes the curved part.

15. The electronic part package body according to claim 10, wherein the plurality of electronic part housing portions houses electronic parts.

16. The electronic part package body according to claim 10, wherein each of the first bonded portion and the second bonded portion has a uniform width.

17. An electronic part package body, comprising:
a carrier tape having a plurality of electronic part housing portions arranged in a longitudinal direction; and
a cover tape covering at least the plurality of electronic part housing portions by being laminated to the carrier tape, wherein
the carrier tape includes a first bonded portion and a second bonded portion that are arranged on outsides of both end portions of the plurality of electronic part housing portions,
the both end portions are in a width direction of the carrier tape,
the first bonded portion and the second bonded portion are arranged in the longitudinal direction of the carrier tape,
the first bonded portion is separated from the second bonded portion in the width direction of the carrier tape,
each of a plurality of first widths of the first bonded portion is within +15% of a first average width of the plurality of first widths,
each of a plurality of second widths of the second bonded portion is within +15% of a second average width of the plurality of second widths,
at least one of the first bonded portion or the second bonded portion includes a plurality of reentrant parts in the longitudinal direction of the carrier tape,
each of the plurality of reentrant parts is continuous from an outside of an electronic part housing portion of the plurality of electronic part housing portions to a region between the plurality of electronic part housing portions, and the plurality of reentrant parts includes at least one of a bent part bonded to the cover tape or a curved part bonded to the cover tape.

18. An electronic part package body, comprising:
a carrier tape having a plurality of electronic part housing portions arranged in a longitudinal direction; and
a cover tape covering at least the plurality of electronic part housing portions by being laminated to the carrier tape, wherein
the carrier tape includes a first bonded portion and a second bonded portion that are arranged on outsides of both end portions of the plurality of electronic part housing portions,
the both end portions are in a width direction of the carrier tape,
the first bonded portion and the second bonded portion are arranged in the longitudinal direction of the carrier tape,
the first bonded portion is separated from the second bonded portion in the width direction of the carrier tape,
each of the first bonded portion and the second bonded portion includes a plurality of reentrant parts in the longitudinal direction of the carrier tape,
each of the plurality of reentrant parts is continuous from an outside of an electronic part housing portion of the plurality of electronic part housing portions to a region between the plurality of electronic part housing portions,
the plurality of reentrant parts includes at least one of a bent part bonded to the cover tape or a curved part bonded to the cover tape,
the first bonded portion is separated from the second bonded portion at the plurality of reentrant parts, and
a separation distance between a reentrant part of the plurality of reentrant parts of the first bonded portion and a reentrant part of the plurality of reentrant parts of the second bonded portion in the width direction of the carrier tape is less than ¾ of a length of an electronic part housed in the electronic part housing portion.

* * * * *